United States Patent
Plant

(10) Patent No.: US 9,629,236 B2
(45) Date of Patent: Apr. 18, 2017

(54) IMPROVEMENTS FOR ELECTRICAL CIRCUITS

(75) Inventor: Philip Plant, Sutton Coldfield (GB)

(73) Assignee: PLASYL LIMITED, Tamworth, Staffordshire (GB)

(*) Notice: Subject to any disclaimer, the term of this patent is extended or adjusted under 35 U.S.C. 154(b) by 203 days.

(21) Appl. No.: 14/008,639

(22) PCT Filed: Mar. 26, 2012

(86) PCT No.: PCT/GB2012/050669
§ 371 (c)(1),
(2), (4) Date: Oct. 31, 2013

(87) PCT Pub. No.: WO2012/131352
PCT Pub. Date: Oct. 4, 2012

(65) Prior Publication Data
US 2014/0097010 A1    Apr. 10, 2014

(30) Foreign Application Priority Data
Mar. 31, 2011   (GB) .................................. 1105495.4

(51) Int. Cl.
*H05K 1/11*  (2006.01)
*H05K 1/02*  (2006.01)

(52) U.S. Cl.
CPC .......... *H05K 1/028* (2013.01); *H05K 1/0283* (2013.01); *H05K 1/118* (2013.01); *H05K 2201/09263* (2013.01)

(58) Field of Classification Search
CPC   H05K 1/00; H05K 1/02; H05K 1/028; H05K 1/0283; H05K 1/118; H05K 1/186;
(Continued)

(56) References Cited

U.S. PATENT DOCUMENTS

| 2,963,535 A | 12/1960 | Wegener et al. |
| 5,785,789 A | 7/1998 | Gagnon et al. |

(Continued)

FOREIGN PATENT DOCUMENTS

| JP | 2009259929 | 11/2009 |
| WO | 2008011771 | 1/2008 |

(Continued)

OTHER PUBLICATIONS

A New Low Cost, Elastic and Conformable Electronics.*
(Continued)

*Primary Examiner* — Timothy Thompson
*Assistant Examiner* — Guillermo Egoavil
(74) *Attorney, Agent, or Firm* — Boyle Fredrickson, S.C.

(57) ABSTRACT

An electrically conductive pathway including a plurality of pathway sections which are connected end to end, and wherein each pathway section includes:
  a) a first elongate part;
  b) a second elongate part;
  c) a first resiliently flexible part connected at one end to an second end of the first part and connected at its opposite end to a first end of the second part; and
  d) a second resiliently flexible part connected at one end to an second end of the second part and connected at its opposite end to a first end of the first part of an adjacent pathway section.

18 Claims, 12 Drawing Sheets

(58) Field of Classification Search
CPC ......... H05K 2201/09263; H05K 13/00; H05K 2201/0133; H05K 2201/09118; H05K 1/189; H05K 3/3436; H05K 3/20; H05K 3/007; H05K 3/284; H05K 3/06; H05K 2201/0355; H05K 2203/016; H05K 2203/1316; H05K 2203/0271; H01L 21/565; H01L 21/6835; H01L 23/3142; H01L 23/49838; H01L 24/81; H01L 2924/0002; H01L 2221/68345; H01L 2924/01033; H01L 2924/0105; H01L 2924/01076; H01L 2924/01082; H01L 2924/014; H01L 2924/01005; H01L 2924/01073; H01L 2924/01029; H01L 2924/01047; H01L 2924/01079; H01L 2924/01013; H01L 2924/01006; H01L 2924/01019; H01L 2924/01078; H01L 23/4985; H01L 2924/01072; H01L 2924/01075; H01L 2224/81001; H01L 2224/81801; H01L 24/16; Y10T 29/49169; Y10T 428/24942; Y10T 29/49002
USPC ..... 174/261; 428/212; 29/854, 592.1, 529.1; 607/115; 361/749
See application file for complete search history.

(56) References Cited

U.S. PATENT DOCUMENTS

| | | |
|---|---|---|
| 2002/0016018 A1 | 2/2002 | Oka et al. |
| 2002/0094701 A1* | 7/2002 | Biegelsen .............. B25J 13/084 439/32 |
| 2003/0047269 A1 | 3/2003 | Tatsumi et al. |
| 2003/0127246 A1 | 7/2003 | Watanabe et al. |
| 2004/0192082 A1 | 9/2004 | Wagner et al. |
| 2004/0238819 A1 | 12/2004 | Maghribi et al. |
| 2004/0243204 A1* | 12/2004 | Maghribi et al. ............. 607/115 |
| 2005/0280157 A1* | 12/2005 | Roush ................. H01L 23/4985 257/773 |
| 2006/0064871 A1 | 3/2006 | Kawakita et al. |
| 2007/0107931 A1 | 5/2007 | Takenaka et al. |
| 2008/0017403 A1 | 1/2008 | Nishii |
| 2008/0257589 A1 | 10/2008 | Ostmann et al. |
| 2008/0285241 A1 | 11/2008 | Hou et al. |
| 2012/0051005 A1* | 3/2012 | Vanfleteren ........... H01L 21/565 361/749 |
| 2012/0052268 A1* | 3/2012 | Axisa ................ H01L 23/49838 428/212 |
| 2014/0340857 A1* | 11/2014 | Hsu ...................... H05K 1/0283 361/749 |

FOREIGN PATENT DOCUMENTS

| | | |
|---|---|---|
| WO | 2010086033 | 8/2010 |
| WO | 2010086034 | 8/2010 |
| WO | 2010086416 | 8/2010 |
| WO | 2010146524 | 12/2010 |

OTHER PUBLICATIONS

Mech Charact of Flexible & Stretch Electr Subst_Wang_2010.*
Interconnect Schemes for Stretchable Array-Sosin_Apr. 2011.*
Interconnects for Stretchable Electronic Circuits_Jun. 2008.*
Brosteaux et al, "Design and Fabrication of Elastic Interconnections for Stretchable Electronic Circuits", IEEE Electron Device Letters, IEEE Service Center. NY, NY, vol. 28, No. 7, Jul. 1, 2007, pp. 552-554.
Fei Hulyang et al, "Nonsinusoidal buckling of thin gold films on elastomeric substrates", Journal of Vacuum Science and Technology: Part A, AVS/AIP, Melville, NY, vol. 27, No. 3, Mar. 24, 2009, p. 9-12.

* cited by examiner

IMPROVEMENTS FOR ELECTRICAL CIRCUITS

BACKGROUND AND SUMMARY OF THE INVENTION

This invention relates to improvements for electrical circuits, particularly in relation to electrical circuit boards for use in electrical devices.

Electrical circuit boards (often referred to as printed circuit boards or PCBs) are used in virtually all electrical devices to support the electrical components thereof and the electrically conductive pathways therebetween. The pathways (commonly referred to as "tracks" or "traces") are typically etched from copper sheets which are laminated onto a non-conductive planar supports, e.g. fibreglass sheet. Layers are then built up one on top of the other and electrical connections made between the pathways of each "layer", as desired, in order to provide the required electrical circuitry between the electrical components.

Printed circuit boards or PCBs provide mechanical support for the electrical components and the pathways of copper due to the rigidity and strength of the fibreglass support layers and are thus the preferred choice for the electrical circuitry and component support for most electrical devices worldwide. Their inherent rigidity, however, and thus their lack of flexibility, can often be a disadvantage, as it can render their integration in certain products difficult.

It has therefore been proposed to substitute the rigid fibreglass support layers of the PCB with a flexible material to provide a circuit board. Such as 'board' can be used in devices which require the circuit board to be capable of being distorted in three dimensions, which is not possible with standard PCBs. However, the current manufacturing methods and the resulting 'boards' have some performance an reliability issues.

According to a first aspect of the invention we provide an electrically conductive pathway including a plurality of pathway sections which are connected end to end, and wherein each pathway section includes:

a) a first elongate part;
b) a second elongate part;
c) a first resiliently flexible part connected at one end to an second end of the first part and connected at its opposite end to a first end of the second part; and
d) a second resiliently flexible part connected at one end to an second end of the second part and connected at its opposite end to a first end of the first part of an adjacent pathway section.

According to a second aspect of the invention we provide an electrically conductive member including a pathway according to the first aspect of the invention.

According to a third aspect of the invention we provide an electrical circuit board including an electrically conductive member according to the second aspect of the invention.

According to a fourth aspect of the invention we provide a method of manufacturing an electrically conductive member, the method comprising the steps of:

positioning a layer of electrically conductive material adjacent a substrate layer;
increasing the temperature of the electrically conductive and substrate layers to a predetermined temperature;
applying pressure to the electrically conductive and substrate layers so as to urge the layers towards each other;
holding the electrically conductive and substrate layers at said temperature for a predetermined time period;
cooling the electrically conductive and substrate layers to a predetermined temperature;
removing unwanted areas of the electrically conductive layer to provide at least one electrically conductive pathway connected to the substrate.

Further features of the various aspects of the invention are set out in the claims appended hereto.

BRIEF DESCRIPTION OF THE DRAWINGS

Examples of the invention will be described by way of example only with reference to the accompanying figures, of which: —

DETAILED DESCRIPTION

Figure 1:
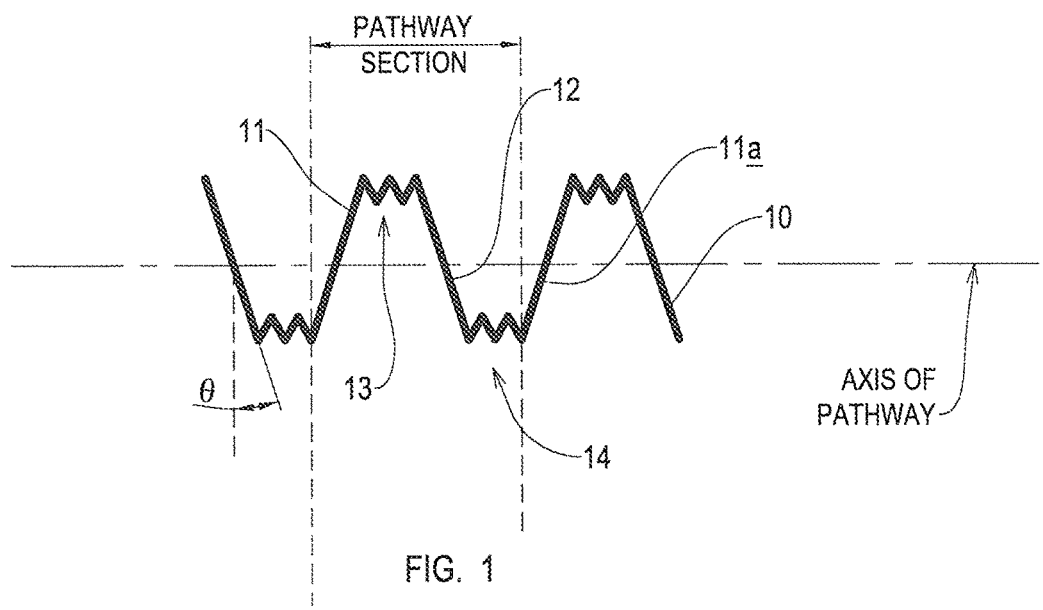
FIG. 1 is a plan view of a first embodiment of a portion of a pathway of the present invention.
Figure 2:
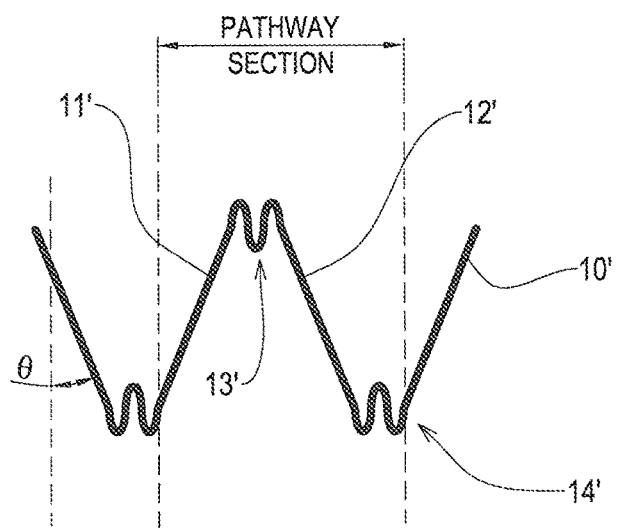
FIG. 2 is a plan view of a second embodiment of a portion of a pathway of the present invention.
Figure 3:
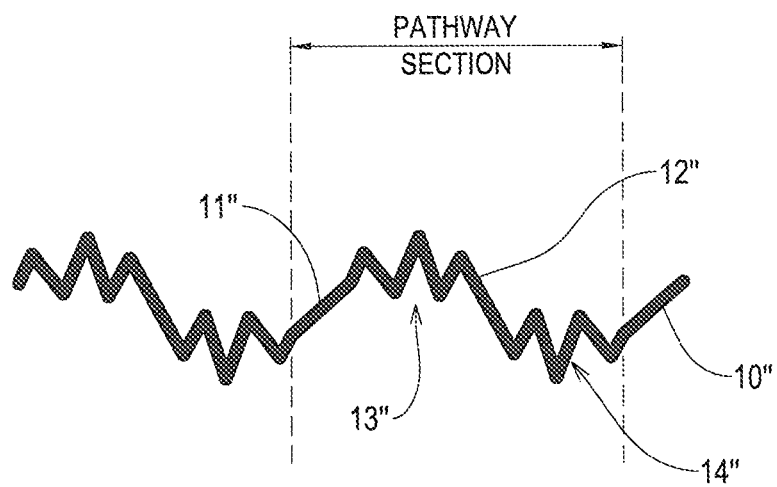
FIG. 3 is a plan view of a third embodiment of a portion of a pathway of the present invention.
Figure 4:
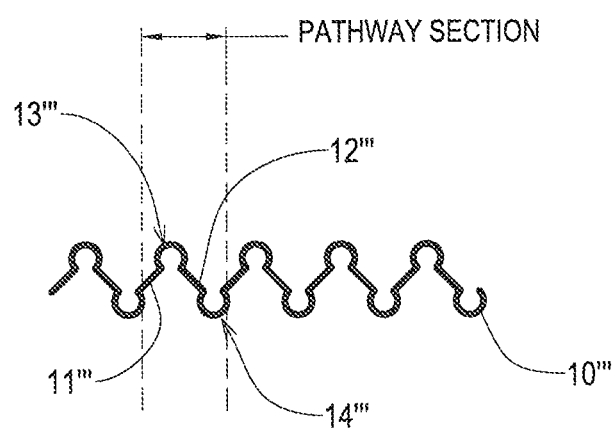
FIG. 4 is a plan view of a fourth embodiment of a portion of a pathway of the present invention.
Figure 5:
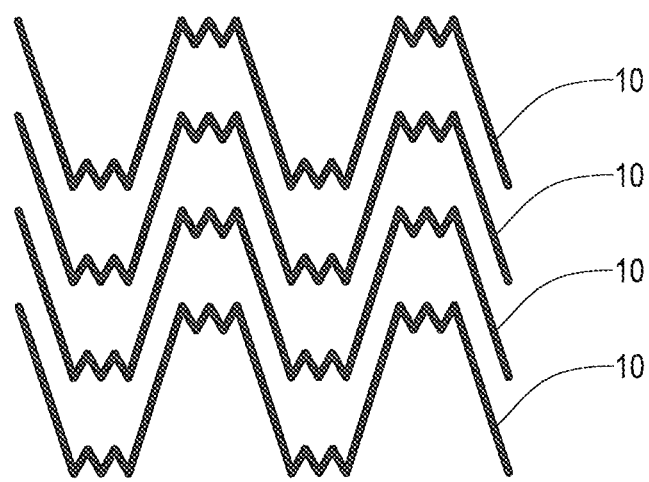
FIG. 5 is a plan view of a plurality of the pathways of FIG. 1 shown in a "stacked" configuration.
Figure 6:
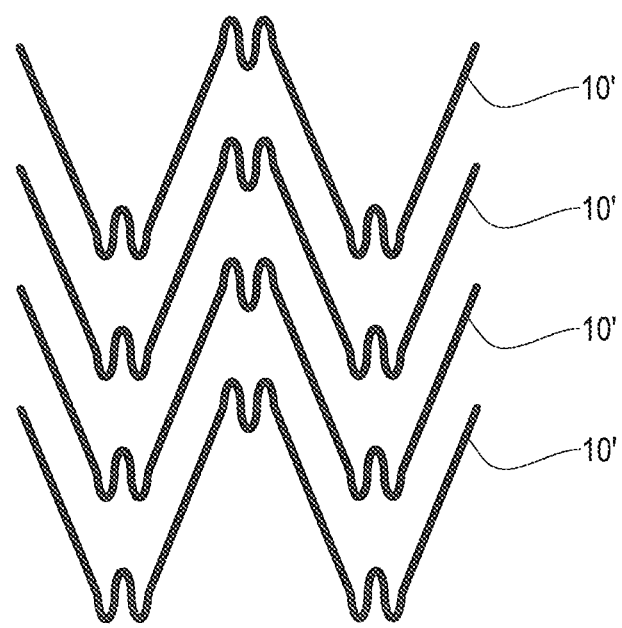
FIG. 6 is a plan view of a plurality of the pathways as shown in FIG. 2 shown in a stacked configuration.
Figure 7:
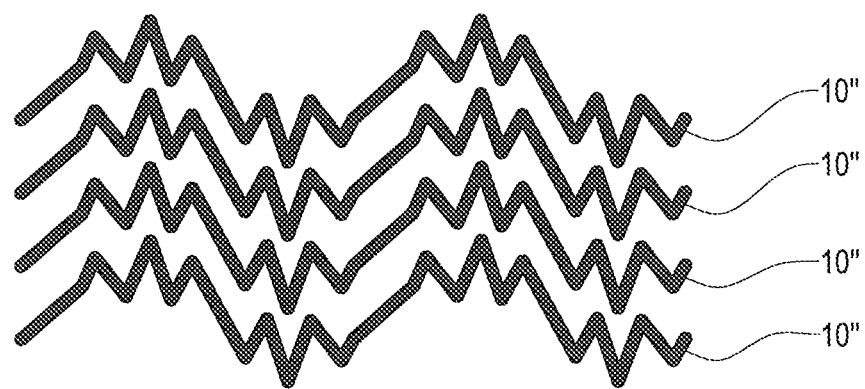
FIG. 7 is a plan view of a plurality of the pathways of FIG. 3 shown in a "stacked" configuration.
Figure 8:
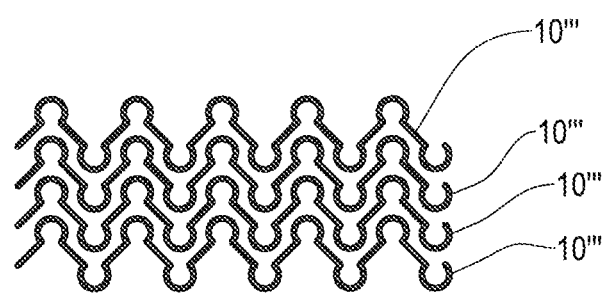
FIG. 8 is a plan view of a plurality of the pathways as shown in FIG. 4 shown in a stacked configuration.

Various phrases and terminology are used throughout this specification, and, unless explicitly mentioned elsewhere, are defined as follows: —

"Pathway density"—is a measure of the number of pathways, when laid side by side per unit length. In the present examples, the unit length is 25 mm, so the figures shown as number of pathways per 25 mm in the width-wise direction.

"Percentage stretch"—is the percentage increase in overall length of the pathway when subjected to a tensile force.

"Pathway thickness"—is a measurement of the thickness/depth of the pathway measured in a direction perpendicular, and generally vertically, to its length.

"Pathway width"—is a measurement of the thickness/depth of the pathway measured in a direction perpendicular, and generally horizontally, to its length.

Referring firstly to FIGS. 1 through 4, these show four embodiments of an electrically conductive pathway in accordance with the present invention. Each of FIGS. 1 through 4 shows a portion of an electrically conductive pathway, for illustration purposes only, and it should be appreciated that the pathway could be any length, as desired, with the pattern repeated. In each embodiment the electrically conductive pathway includes a plurality of pathway sections which are connected end to end. FIGS. 1 through 4 include dash lines which indicate the start and end point of each pathway section, for ease of reference.

For ease of reference, like features of the embodiments shown in FIGS. 1 through 4 have been given the same reference numeral, with the addition of single, double or triple prime (') symbols. Thus, referring to FIG. 1, each pathway section includes a first generally rectilinear elongate part 11 and a second generally rectilinear elongate part 12. The first and second elongate parts 11, 12 are connected to each other by a first resiliently flexible part 13, and the pathway section includes a second resilient flexible part 14 which is connected to an opposite end of the part 12 and to an end of a first part of an adjacent pathway section (see for example the part 11a in FIG. 1).

Thus, it is clear from FIGS. 1 to 4 that the pathway 10 is made up from a plurality of pathway sections which are connected end to end. In the present examples the pathway sections are identical to each other for each embodiment, and are repeated, but it should be appreciated that variances between adjacent sections could be provided without departing from the scope of the present invention.

In the embodiments shown in FIGS. 1 through 4 the first and second resiliently flexible parts 13, 14 are provided as biasing member or springs which permit the elongate parts 11, 12 to move/pivot relative to each other when the pathway 10 is subject to a tensile of force. FIGS. 1 through 4 show four different variants of the first and second resiliently flexible parts 13, 14 and it should be appreciated that other shapes/configurations of these parts could be utilised without departing from the scope of the present invention. In the embodiment shown in FIGS. 1, 2 and 3 the resiliently flexible parts includes V, U or W shaped sections of pathway, whilst the embodiment in FIG. 4 utilises a part-circular portion 13''', 14'''. In all four embodiments the parts 13, 14 permit the respective ends of the parts 11, 12 to pivot relative to each other thus permitting the pathway 10 to increase (stretch) in length when subjected to a tensile force, but without the pathway 10 being damaged as a result of that tensile force.

Of course, as in indicated in the description hereinafter, there is a "safe" limit to which the pathway 10 can be stretched, without compromising the integrity of the pathway 10. In other words, it will be appreciated by those skilled in the art that an amount of extension will be tolerated by the pathway 10 of the present invention, without the pathway breaking, and thus not being able to conduct electricity from one end to its opposite end.

Figure 15:
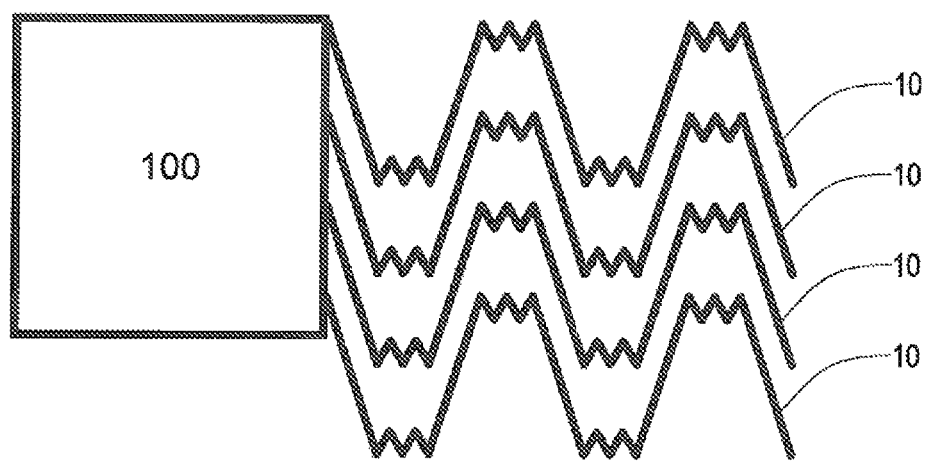
FIG. 15 is a view similar to FIG. 5 illustrating the pathway incorporated into a circuit board.

As shown in FIGS. 5 through 8, the configuration of the electrically conductive pathways 10 of the present invention, particularly the embodiment shown in FIGS. 1 through 4, are highly advantageous over the prior art due to their ability to be positioned closely adjacent (side-by-side) each other. FIGS. 5 through 8 show "stacked" pathways corresponding to the embodiments of FIGS. 1 through 4. The ability to "stack/position" the pathways 10 in this way is highly advantageous, because the lateral distance between corresponding points an adjacent pathways is also constant substantially along the entire length of the pathway. For example, with reference to FIG. 6, the lateral distance between the points F and G is the same is the lateral distance between the points H and I. This results in improved performance when the pathway(s) is incorporated into a circuit hoard 100 as shown in FIG. 15, because signal integrity is improved, controlled impedance matching is achieved and because the pathway density is improved over any given distance.

In each of the examples shown in FIGS. 5 through 8, it will be noted that the first and second resiliently flexible parts 13, 14 of one pathway 10 are received in spaces defined in between the first and second elongate parts 11, 12 of an adjacent pathway 10. This allows the pathways 10 to be positioned closely adjacent each other so that a higher number of pathways 10 can be provided over a desired width—i.e. an increased pathway/track density.

As can be seen in the figures the first and second elongate parts of each pathway section are oblique to an elongate axis of the pathway 10 and are inclined at an angle θ to each other. As is demonstrated from the graphs shown in the attached figures, a preferred range of angle is between 15° and 75°. More preferably the angle between the first and second elongate parts is 30° to 60°. Most preferably the angle is between 40° and 50°, with a particularly desired angle being 45°. The angle between the first and second parts 11, 12 needs to be selected bearing in mind the desired pathway/track density required for a particular use (i.e. how many pathways 10 are desired to be positioned adjacent each other) and the desired percentage stretch or stretchability of pathways in use. All of these factors/physical characteristics need to be considered together.

In addition to the angle between the first and second parts 11, 12 affecting the stretchability and pathway/track density, the length of the first and second elongate parts 11, 12 and the configuration/shape of the resiliently flexible parts 13, 14 can also have an effect on the stretchability and pathway/track density.

Figure 9:
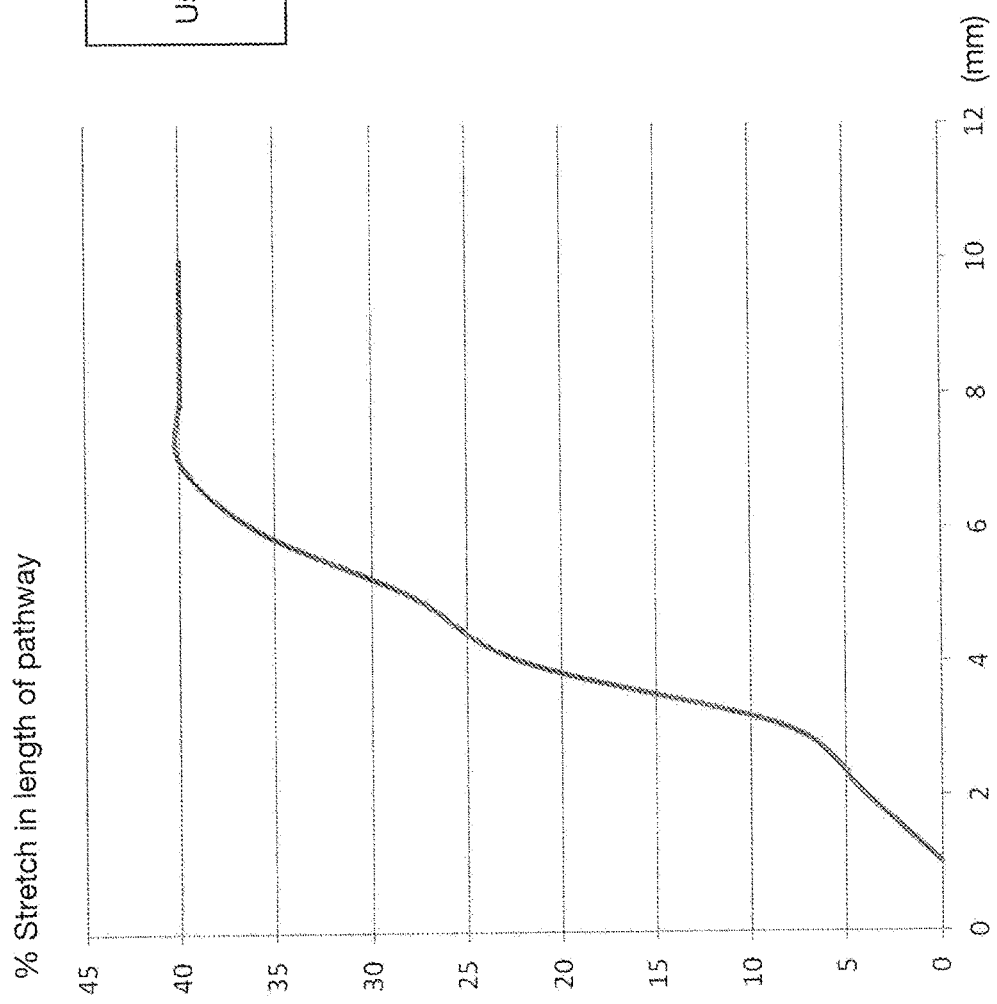
FIG. 9 is a graph plotting the relationship between the 'percentage stretch' of a pathway of the present invention and the length of the first and second elongate parts of the pathway. The graph illustrates a pathway manufactured from copper foil which has a thickness of 35 microns and a width of 0.1 mm and where the angle between the first and second elongate parts of the pathway is 45°.

Referring to FIG. 9, this shows a graph plotting the relationship between the length of the first and second elongate parts 11, 12 of the pathway 10 and the achievable percentage stretch of the pathway before failure. The graph has been created using data points from an experimentation using 35 micron copper and where the angle between the first and second elongate parts is 45°. The width of each pathway is 0.10 mm and the minimum spacing between adjacent sections of the pathway is 0.1 mm. It can be seen from FIG. 9 that increasing the length of the first and second elongate parts above about 7 mm does not provide an improved a percentage stretch of the pathway.

Figure 10:
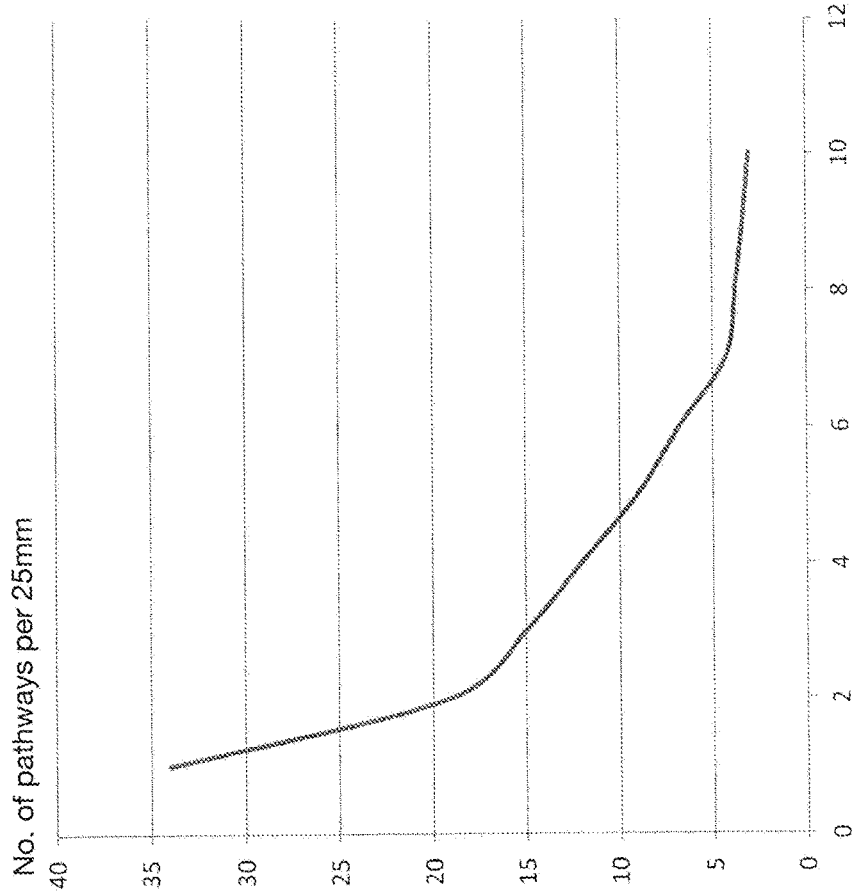
FIG. 10 is a graph plotting the relationship between 'track density' and the length of the first and second elongate parts of the pathway.

Referring to FIG. 10, this shows a graph plotting the relationship between the length of the first and second elongate parts 11, 12 of the pathway 10 and the achievable pathway density. The graph has been created using data points from an experimentation using 35 micron copper and where the angle between the first and second elongate parts is 45°. The width of each pathway is 0.10 mm and the minimum spacing between adjacent sections of the pathway is 0.1 mm.

The graph of FIG. 10 demonstrates the relationship between these two parameters, and highlights that a greater pathway density can be achieved by reducing the length of the elongate parts. However, this is only one variable of the shape/configuration of the pathway and thus other factors need to be taken into account, such as the percentage stretch in length of the pathway whilst maintaining integrity of the pathway.

Figure 11:
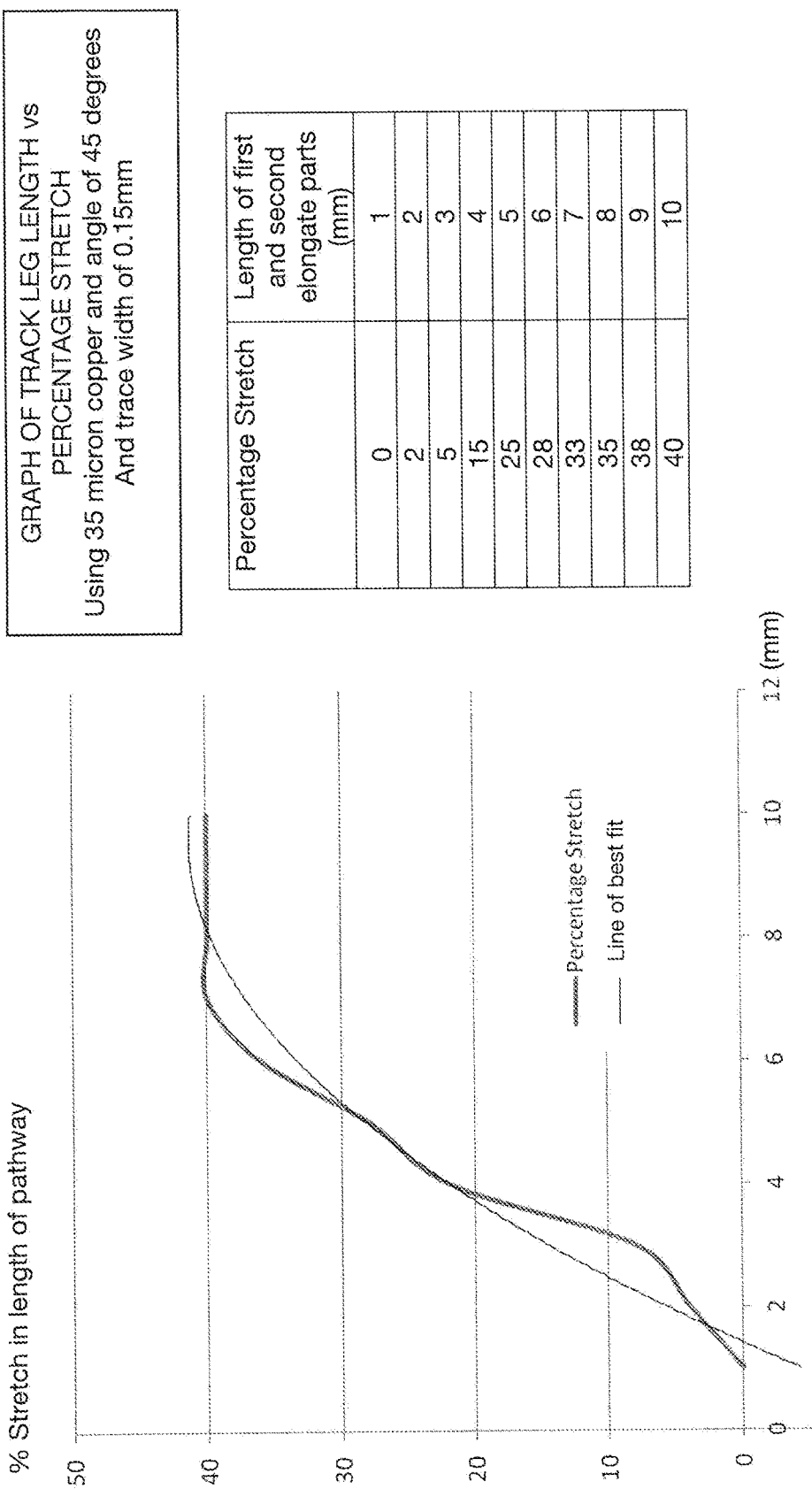
FIG. 11 is a graph plotting the relationship between the 'percentage stretch' of a pathway of the present invention and the length of the first and second elongate parts of the pathway. The graph illustrates a pathway manufactured from copper foil which has a thickness of 35 microns and a width of 0.15 mm and where the angle between the first and second elongate parts of the pathway is 45°.
Figure 12:
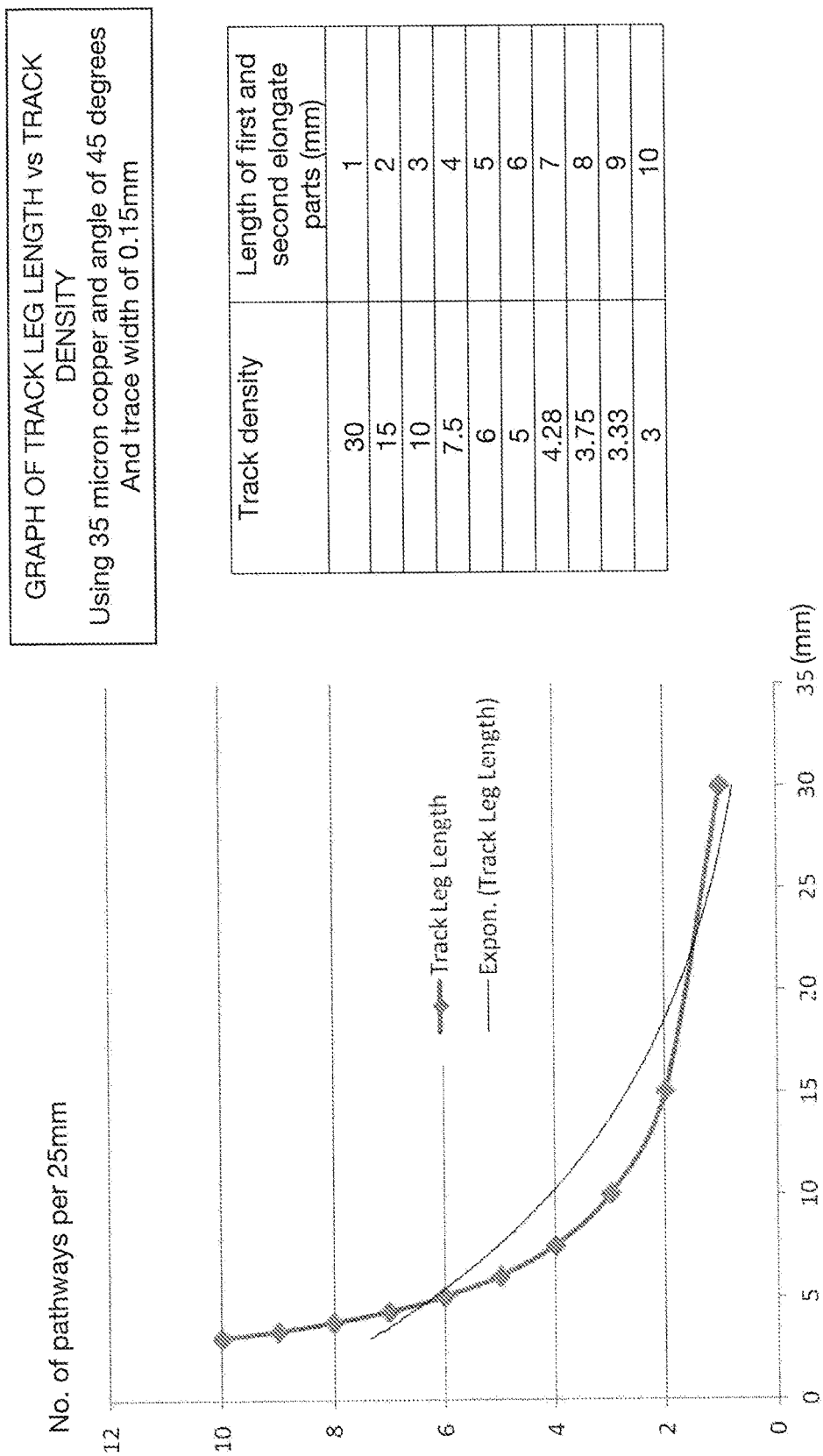
FIG. 12 is a graph plotting the relationship between 'track density' and the length of the first and second elongate parts of the pathway.

FIGS. 11 and 12 correspond to FIGS. 9 and 10 except that in these experiments the pathway width is 0.15 mm. It can be seen from FIG. 11 that little improvement in percentage stretch is achieved when the length of the first and second parts exceeds ⅞ mm and FIG. 12 illustrates that a reduction in the length of the first and second elongate parts 11, 12 gives rise to a higher pathway density per 25 mm measured in the lateral dimension of the pathways.

Figure 13:
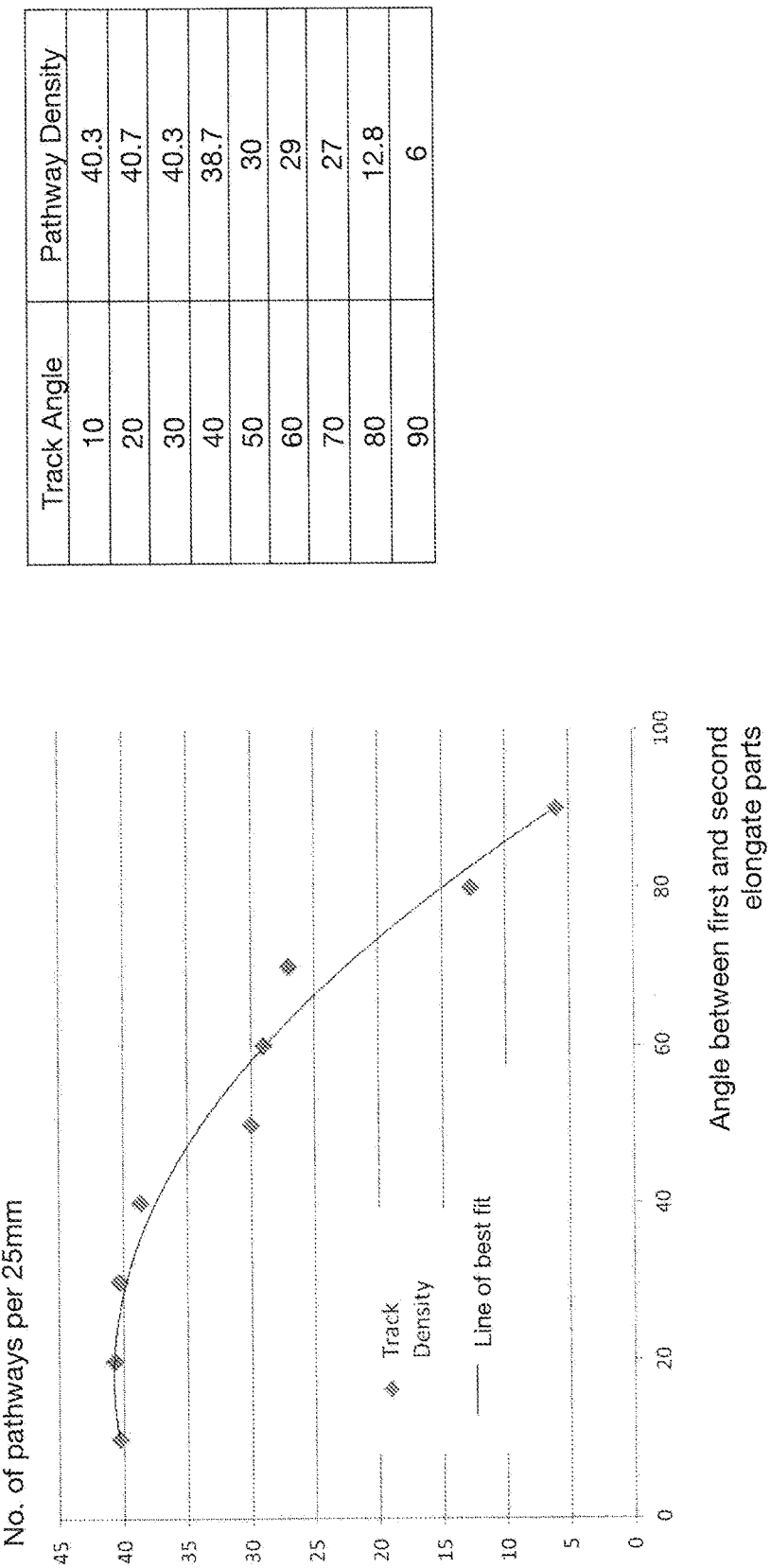
FIG. 13 is a graph plotting track density against the angle between the first and second elongate parts of the pathway.

FIG. 13 illustrates the relationship between the angle θ between the first and second elongate parts 11, 12 and the achievable pathway density per 25 mm. In this example the pathways are 0.1 mm in width and 35 microns thick with the length of the first and second parts being 3 mm. This graph illustrates that achievable pathway density does not greatly improve when the angle exceeds 40°. This graph highlights that a track angle of between 30° and 60° would provide the highest pathway density, but of course, the percentage stretch also needs to be taken into account as demonstrated in the other figures.

Figure 14:
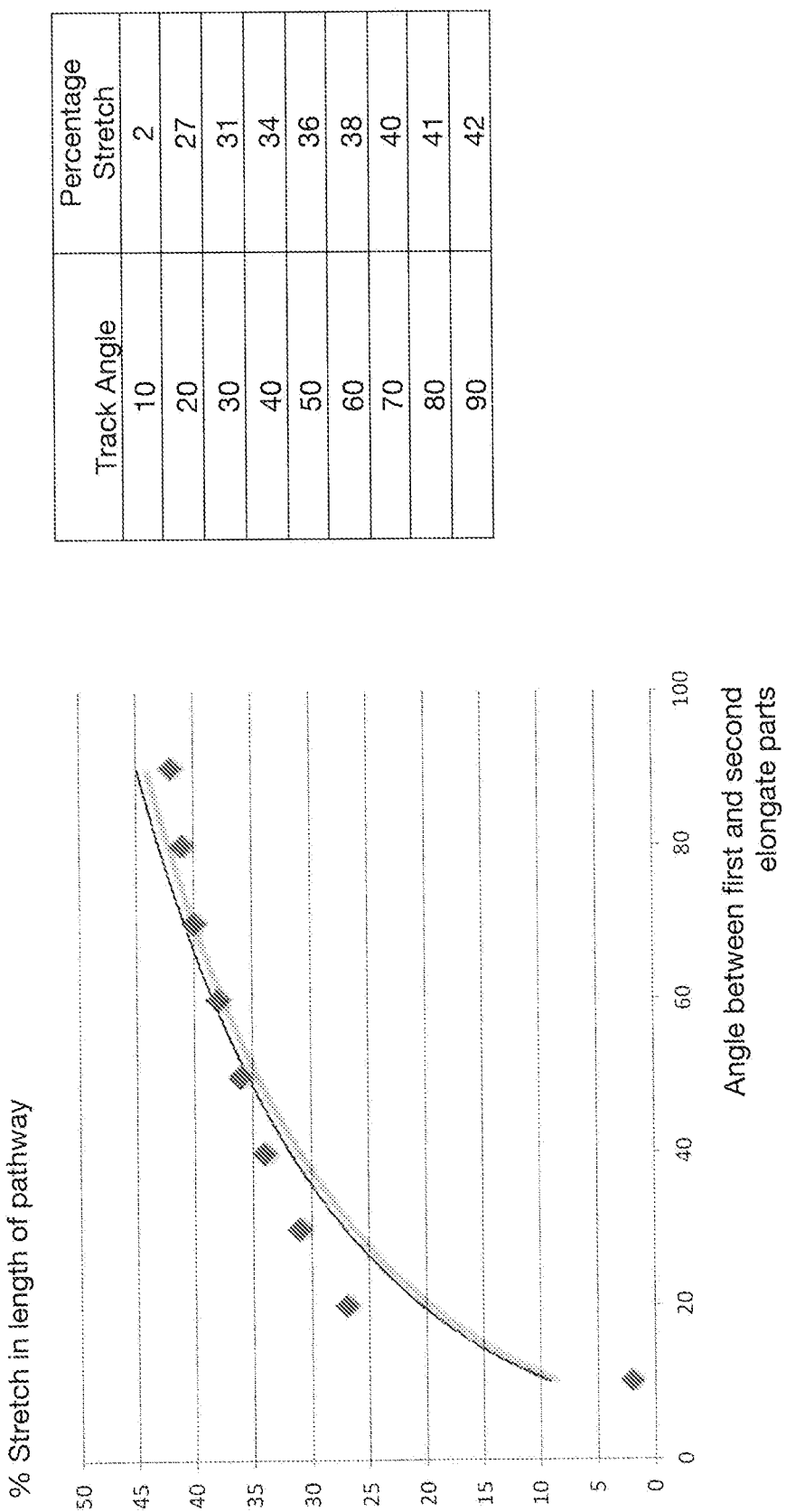
FIG. 14 is a graph plotting the percentage stretch against the angle between the first and second elongate parts of a pathway of the present invention.

FIG. 14 illustrates that an increase in the angle between the first and second elongate parts 11, 12 does indeed result in increased stretchability of the pathway. That said, this graph illustrates that there is little improvement in the percentage stretch of the pathway when the angle θ between the first and second elongate parts exceeds 50°. Thus, the graphs indicate that an angle between the first and second parts 11, 12 of about 45° provides good stretchability whilst also providing a satisfactory performance in terms of track/pathway density. In this example the pathways are 0.1 mm in width and 35 microns thick with the length of the first and second parts being 3 mm.

The applicant has devised the following method for manufacturing an electrically conductive member which may be used as part of an electrical circuit board including the pathways according to the invention. The method has been derived starting from known methods for manufacturing printed circuit boards having copper layers which are bonded to (and usually sandwiched between) fibreglass layers. However, it should be noted that simply replicating existing manufacturing methods does not work when attempting to manufacture an electrically conductive member having the stretchable pathways of the present invention. The applicant has therefore devised the following methodology, which works surprisingly well.

In a similar fashion to existing printed circuit board manufacturing methods, a layer of electrically conductive material, e.g. copper foil, is positioned on a substrate. In the present example, the layer of copper foil can be of any desired thickness, for example 0.15 mm. The copper foil can be any desired thickness, but usually will be selected from the range of 12 to 79 microns. The substrate layer is a flexible plastics material of substantially uniform thickness, and the applicant has found that polyurethane is a preferred choice, due to its physical characteristics, as discussed below. Preferably, the polyurethane used has a thickness of 25 or 50 microns, but any desired thickness can be used. It should be noted, however, that an increased thickness will reduce the stretchability of the resulting electrically conductive member, but too thin a substrate can easily become damaged.

It is necessary to bond/connect the copper foil to the polyurethane substrate layer, as a first step in the manufacturing process. Although this bond can in one example be achieved by using an adhesive, the applicant has surprisingly found that the polyurethane substrate layer and copper foil layer will bond to each other, without any need for additional adhesive, by using the applicant's inventive method. The following methodology utilises pressure and temperature to heat-bond the copper foil to the polyurethane substrate.

The copper foil layer is placed on top of the polyurethane layer (or vice versa) and the layers are then positioned between a pair of substantially flat heatable plates. The assembly (i.e. copper foil layer, polyurethane layer and plates) is then placed in an laminating press (although any heating device could be used) which includes a means for applying pressure to the plates so as to force the polyurethane substrate and copper foil layer towards each other. The temperature of the plates is gradually increased to a predetermined value, which in this example is 120° C. (+ or −8° C.), and is held at that temperature for a predetermined time period, which in this example is about 1 hour. A shorter time period can be used, but it should be noted that applicant has found that a minimum time required to achieve a good bond between the layers is 50 minutes. If the assembly is left in the laminating press for more than 70 minutes, the substrate will likely loose is elastic properties.

The pressure applied to the plates is between 150 PSI and 170 PSI (preferably @ 155 PSI), and the pressure is gradually increased until this value is reached. Preferably the pressure is applied in two stages, with stage one being at 50 PSI and lasting for 15 minutes and stage two being at the final pressure (e.g. 155 PSI) for the remaining bond time.

The assembly is then cooled, until a desired temperature of the plates is reached, for example 40° C. (this means that the assembly can easily be handed by a person). A pressure (e.g. 50 PSI) is maintained on the plates until the cooled temperature is reached. The plates are removed to reveal the composite copper foil/polyurethane layer (which layers have heat-bonded to each other).

An additional layer of copper foil may be positioned on an opposite side of the substrate layer, before the layers are placed in between the plates. In other words, two copper foil layers could be provided, sandwiching the substrate layer. In such an embodiment, each copper layer heat bonds to its respective side of the substrate layer.

Now that the copper foil layer bonded to the substrate, it is necessary to create in the copper foil layer the pathways of the present invention. This is achieved, in broad terms, by exposing unwanted copper (i.e. that which does not form part of the desired number of pathways) to an etchant. First, however, it is necessary to define on the copper surface the areas to form part of the pathway(s). This is achieved by covering the copper surface with a photoimageable layer, which is then dried. The photoimageable layer is then covered with a mask (which has openings defining the areas which form of the pathways), e.g. silver halide. The exposed areas of the photoimageable layer are then exposed assembly to UV light, thus causing them to harden. The assembly is then developed in a liquid which removes the unhardened areas of the photoimageable layer. The assembly is then baked in an oven at about 120° C. for about 3 hours. Lower temperature can be used, but will result in an increased baking time. The temperature should not exceed 125° C. as this will destroy the substrate material.

The assembly is then exposed to an etchant (e.g. cupric chloride) to remove the exposed copper (i.e. the copper which does not form part of the pathways).

The assembly is then exposed to another etchant (e.g. a caustic/amine liquid) to remove the remaining photoimageable layer, thus leaving the polyurethane substrate layer with a plurality of pathways connected thereto.

If the free ends of the pathways are to be provided with solder pads (as they are known in the art) then the method may include, before etching the assembly in cupric chloride, the additional steps of applying a further layer of photoimageable material to the copper side of the assembly and using a mask to expose only the solder pads. The assembly is then exposed to UV light for a second time, which hardens only the solder pad areas of the second photoimageable layer. The assembly may be micro-etched prior to the second layer of photoimageable material being applied to remove an oxide build up on the surface. The assembly is then, as described above, etched to remove all of the photoimageable material, thus leaving the pathways and their respective solder pads.

The resulting electrically conductive member then has a solderable finish applied to the copper pathways, by immersion in liquid containing silver.

If desired, a further substrate layer is then heat bonded to the copper pathways and the other substrate, to provide insulation for the pathways. It will be necessary, of course, for the solder pads to remain exposed, so that components, for example, can be connected thereto. The result is therefore a three layer electrically conductive member having a plurality of pathways which are sandwiched in between two polyurethane substrate layers.

It should be appreciated that although in the above described method a copper foil layer is used, which is then etched to remove copper not forming the pathway, an alternative method could include the step of manufacturing the pathways and then adhering the pathways to the substrate, thus eliminating the need for the etching step.

When used in this specification and claims, the terms "comprises" and "comprising" and variations thereof mean that the specified features, steps or integers are included. The terms are not to be interpreted to exclude the presence of other features, steps or components.

The features disclosed in the foregoing description, or the following claims, or the accompanying drawings, expressed in their specific forms or in terms of a means for performing the disclosed function, or a method or process for attaining the disclosed result, as appropriate, may, separately, or in any combination of such features, be utilised for realising the invention in diverse forms thereof.

The invention claimed is:

1. An electrically conductive pathway including a plurality of pathway sections which are connected end to end, and wherein each pathway section includes:
   a) a first generally rectilinear elongate part;
   b) a second generally rectilinear elongate part;
   c) a first resiliently flexible part connected at one end to a second end of the first generally rectilinear elongate part and connected at its opposite end to a first end of the second generally rectilinear elongate part; and
   d) a second resiliently flexible part connected at one end to a second end of the second generally rectilinear elongate part and connected at its opposite end to a first end of the first generally rectilinear elongate part of an adjacent pathway section;

wherein the first and second generally rectilinear elongate parts of the pathway section are each inclined at an angle to an elongate axis of the pathway, and each resiliently flexible part includes a plurality of portions which are connected and resiliently moveable relative to each other, and wherein at least a part of each resiliently flexible part is V, U or W-shaped in plan view.

2. An electrically conductive pathway according to claim 1 wherein the plurality of pathway sections are substantially identical to each other.

3. An electrically conductive pathway according to claim 1 wherein the first and second generally rectilinear elongate parts of the pathway section are oblique to an elongate axis of the pathway.

4. An electrically conductive pathway according to claim 1 wherein the angle is in the range of 15° to 75°.

5. An electrically conductive pathway according to claim 4 wherein the angle is in the range of 30° to 60°.

6. An electrically conductive pathway including a plurality of pathway sections which are connected end to end, and wherein each pathway section includes:
   a) a first generally rectilinear elongate part;
   b) a second generally rectilinear elongate part;
   c) a first resiliently flexible part connected at one end to a second end of the first generally rectilinear elongate part and connected at its opposite end to a first end of the second generally rectilinear elongate part; and
   d) a second resiliently flexible part connected at one end to a second end of the second generally rectilinear elongate part and connected at its opposite end to a first end of the first generally rectilinear elongate part of an adjacent pathway section;

wherein the first and second generally rectilinear elongate parts of the pathway second are each inclined at an angle to an elongate axis of the pathway, and each resiliently flexible part includes a plurality of portions which are connected and resiliently moveable relative to each other, and where:
   1) at least one of the portions of each resiliently flexible part is substantially rectilinear, or oblique to an elongate axis of the pathway; or
   2) all portions of each resiliently flexible part are oblique to an elongate axis of the pathway; or
   3) adjacent portions of each resiliently flexible part are inclined at an angle to each other.

7. An electrically conductive pathway according to claim 6 wherein the angle is in the range of 30° to 60°.

8. An electrically conductive pathway according to claim 7 wherein at least one of the portions of each resiliently flexible part is non-linear, or at least one of the portions of each resiliently flexible part is curved.

9. An electrically conductive pathway including a plurality of pathway sections which are connected end to end, and wherein each pathway section includes:
   a) a first generally rectilinear elongate part;
   b) a second generally rectilinear elongate part;
   c) a first resiliently flexible part connected at one end to a second end of the first generally rectilinear elongate part and connected at its opposite end to a first end of the second generally rectilinear elongate part; and
   d) a second resiliently flexible part connected at one end to a second end of the second generally rectilinear elongate part and connected at its opposite end to a first end of the first generally rectilinear elongate part of an adjacent pathway section;

wherein the first and second generally rectilinear elongate parts of the pathway section are each inclined at an angle to an elongate axis of the pathway, and each resiliently flexible part includes a plurality of portions which are connected and resiliently moveable relative to each other, and wherein an overall width of each of the first and second resiliently flexible parts, when measured in a direction perpendicular to an elongate axis of the pathway, is between 10% and 30% of the overall width of the pathway.

10. An electrically conductive pathway according to claim 1 wherein an overall width of each of the first and second resiliently flexible parts, when measured in a direction perpendicular to an elongate axis of the pathway, is between 15% and 25%, of the overall width of the pathway.

11. An electrically conductive pathway according to claim 1 wherein the first and second elongate parts define a space therebetween configured to receive a first or second resiliently flexible part of an adjacent pathway, and wherein the space defined between the first and second elongate parts is substantially trapezoidal.

12. An electrically conductive member including an electrically conductive pathway according to claim 1.

13. An electrically conductive member according to claim 12 including two electrically conductive pathways positioned adjacent each other, and wherein
   a) the first resiliently flexible parts of one pathway are received in spaces defined in between the first and second elongate parts of the adjacent pathway, or wherein
   b) the two electrically conductive pathways are positioned next to each other such that an elongate axis of one pathway extends through the first and second elongate parts of the adjacent pathway.

14. An electrically conductive member according to claim 13 wherein a lateral distance between corresponding points on adjacent pathways is constant substantially along the entire length of the conductive member and during extension of the member under a tensile force.

15. An electrically conductive member according to claim 14 wherein the member includes a substrate supporting the electrically conductive pathway(s), and wherein
   a) the electrically conductive pathway(s) is connected to a surface of the substrate, or wherein
   b) the electrically conductive pathway(s) is adhered or bonded to a surface of the substrate.

16. An electrical circuit board including an electrically conductive member according to claim 12.

17. A method of making an electrically conductive pathway as set forth in claim 1.

18. An electrically conductive pathway including a plurality of pathway sections which are connected end to end, and wherein each pathway section includes:
   a) a first elongate part;
   b) a second elongate part;
   c) a first resiliently flexible part connected at one end to a second end of the first elongate part and connected at its opposite end to a first end of the second elongate part; and
   d) a second resiliently flexible part connected at one end to a second end of the second elongate part and connected at its opposite end to a first end of the first elongate part of an adjacent pathway section;
wherein an overall width of each of the first and second resiliently flexible parts, when measured in a direction perpendicular to an elongate axis of the pathway, is between 10% and 30% of the overall width of the pathway.

* * * * *